US011095262B2

(12) United States Patent
Garcia Gonzalez et al.

(10) Patent No.: US 11,095,262 B2
(45) Date of Patent: Aug. 17, 2021

(54) CIRCUIT ARRANGEMENT AND A METHOD FOR OPERATING A CIRCUIT ARRANGEMENT

(71) Applicant: ams AG, Premstaetten (AT)

(72) Inventors: Jose Manuel Garcia Gonzalez, Premstaetten (AT); Rafael Serrano Gotarredona, Premstaetten (AT)

(73) Assignee: AMS AG, Premstaetten (AT)

( * ) Notice: Subject to any disclaimer, the term of this patent is extended or adjusted under 35 U.S.C. 154(b) by 17 days.

(21) Appl. No.: 16/631,246

(22) PCT Filed: Jul. 18, 2018

(86) PCT No.: PCT/EP2018/069487
§ 371 (c)(1),
(2) Date: Jan. 15, 2020

(87) PCT Pub. No.: WO2019/016256
PCT Pub. Date: Jan. 24, 2019

(65) Prior Publication Data
US 2020/0220510 A1 Jul. 9, 2020

(30) Foreign Application Priority Data

Jul. 20, 2017 (EP) .................................. 17182348

(51) Int. Cl.
*H03F 3/45* (2006.01)
*H03F 3/38* (2006.01)
(52) U.S. Cl.
CPC ........... *H03F 3/45475* (2013.01); *H03F 3/38* (2013.01); *H03F 2200/129* (2013.01);
(Continued)
(58) Field of Classification Search
CPC ....................................................... H03F 3/45
(Continued)

(56) References Cited

U.S. PATENT DOCUMENTS 7,167,119 B1   1/2007 Lei et al.
8,390,372 B2 * 3/2013 Buter ...................... H03F 3/005
                                                    330/9
(Continued)

FOREIGN PATENT DOCUMENTS

EP          3379726          9/2018

OTHER PUBLICATIONS

European Patent Office, International Search Report for PCT/EP2018/069487 dated Sep. 12, 2018.
(Continued)

*Primary Examiner* — Henry Choe
(74) *Attorney, Agent, or Firm* — MH2 Technology Law Group LLP

(57) ABSTRACT

A circuit arrangement comprises a first input node, a first output node, a sampling capacitor means and a first switching means being switchable between a first switching state and a second switching state. The first switching means is coupled to the sampling capacitor means, the first input node and the first output node in such a way that the sampling capacitor means is conductively connected to the first input node and disconnected from the first output node in the first switching state and the sampling capacitor means is disconnected from the first input node and conductively connected to the first output node in the second switching state. A first charge-storing element is coupled via a second switching means to the first input node in such a way that the charge-storing element is charged in the first switching state and discharged in the second switching state, thereby at least partly compensating current flow for charging the sampling capacitor means in the first switching state.

18 Claims, 4 Drawing Sheets

(52) U.S. Cl.
CPC .. *H03F 2200/156* (2013.01); *H03F 2200/271* (2013.01); *H03F 2200/372* (2013.01); *H03F 2203/45116* (2013.01); *H03F 2203/45134* (2013.01); *H03F 2203/45136* (2013.01); *H03F 2203/45174* (2013.01); *H03F 2203/45551* (2013.01); *H03F 2203/45588* (2013.01); *H03F 2203/45592* (2013.01); *H03F 2203/45616* (2013.01)

(58) Field of Classification Search
USPC .......................................... 330/9, 260, 261
See application file for complete search history.

(56) References Cited

U.S. PATENT DOCUMENTS 9,571,118 B1      2/2017  Gupta et al.
2006/0119412 A1   6/2006  Wei

OTHER PUBLICATIONS

LTC 2493 Datasheet Linear Technologies, "24-Bit 2-/4-Channel AΣ ADC with Easy Drive Input Current Cancellation and 12 C Interface", 2006.
Mayes, M.: ""Easy Drive" Delta-Sigma Analogto-Digital Converters Cancel Input Current Errors" Linear Technologies, design note 368, 2005.
Sherry, A.: "Input buffers in Sigma-delta ADCs" Analog Devices, Application note AN-608, 2003.
Wu, J.: "Input currents for high-resolution ADCs" Texas Instruments, application report SBAA090, Apr. 2003.

\* cited by examiner

US 11,095,262 B2

CIRCUIT ARRANGEMENT AND A METHOD FOR OPERATING A CIRCUIT ARRANGEMENT

The present disclosure concerns a circuit arrangement and a method for operating such a circuit arrangement. The circuit arrangement may serve as a switched capacitor sampling circuit.

BACKGROUND

A switched capacitor is an electronic circuit element used for discrete-time signal processing, e.g. sampling. Charges are moved into and out of the sampling capacitor when switches are opened (OFF) and closed (ON).

A generic switched capacitor sampling circuit is shown in FIG. 1. The circuit allows to sample a differential input voltage Vp−Vn into a sampling capacitor Cs. The sampled voltage may be provided to a further circuit 2 or rest of circuitry. Such a switched capacitor sampling circuit may be used in an analog-to-digital converter (ADC).

A switched capacitor sampling circuit may be used in resistive sensors, which are used in many applications to measure physical parameters, e.g. humidity, pressure, liquid level and purity, and proximity. In order to be accurate enough, the measurement of such physical parameters requires a very high impedance input analog front-end. Conventional implementations decouple input nodes of the circuit from switches with buffers also designated as buffer amplifiers. Such an arrangement is shown in FIG. 2, in which the input current is provided by the buffer amplifiers instead of by the input signal being applied to the input nodes 11, 12. The main drawbacks of using input buffer amplifiers in front of the sampling circuit are: Noise and offset voltages of the buffers are introduced into the sampled voltage. Current consumption and space requirement of the system are increased.

The implementation of a high input impedance ADC by decoupling the input nodes from the sampling structure by means of buffers is shown in Analog Devices, Application Note AN-608, "Input Buffers on Σ-Δ ADCs" and Texas Instruments, Application Report SBAA090, "Input Currents for High-Resolution ADCs". These documents show usual implementations using buffers permanently with consequent noise performance degradation and increased current consumption.

Noise injection from buffers into the input signal may be avoided by means of partial sampling. In this approach, half of the sampling phase is performed using the buffer, whereas the second half is performed using the input signal. The drawback of this method is that the buffers' speed has to be twice as high in order to achieve good settling of the output voltage within one half of a settling period.

A sampling scheme of a sigma-delta ADC is used in order to cancel out a differential input current without using buffers as shown in Linear Technologies, Design Note 368, "'Easy Drive' Delta-Sigma Analog-to-Digital Converters Cancel Input Current Errors" and Linear Technologies, LTC2493 Datasheet. However, the common mode input current is not cancelled out and its contribution relies on fully symmetrical inputs' voltages or adjusting the input common mode to the references voltages' common mode.

SUMMARY

In one embodiment a circuit arrangement comprises a first input node, a first output node, a sampling capacitor means and a first switching means being switchable between a first switching state and a second switching state. The first switching means is coupled to the sampling capacitor means, the first input node and the first output node in such a way that the sampling capacitor means is conductively connected to the first input node and disconnected from the first output node in the first switching state and the sampling capacitor means is disconnected from the first input node and conductively connected to the first output node in the second switching state. A first charge-storing element is coupled via a second switching means to the first input node in such a way that the charge-storing element is charged in the first switching state and discharged in the second switching state, thereby at least partly compensating current flow from the first input node for charging the sampling capacitor means in the first switching state. In other words, the charge-storing element serves as current compensation means. A compensation current flows to the first input node in the second switching state.

The switching means may comprise several switches, each being switchable between a conducting state regarded as ON and a non-conducting state regarded as OFF. In the conducting state the switch forms a conductive connection between elements or nodes to which the switch is directly connected, the conductive connection allowing current flow between these elements or nodes. In the non-conducting state the switch forms a disconnection, which avoids current flow between the elements or nodes to which the switch is directly connected.

The sampling capacitor means comprises at least one sampling capacitor. Each switching cycle of the switching means that includes the first switching state and the second switching state transfers a certain amount of charge from the input node to the output node using the sampling capacitor means.

The charge-storing element may comprise a capacitor that serves as a charge-pumping means forming a charge source for providing a current flowing to the input node in the second switching state, thereby at least partly compensating current flow for charging the sampling capacitor means in the first switching state.

The circuit arrangement may further comprise a second input node and a second output node, which allows to apply a differential input voltage across the first and second input nodes and to provide a differential output voltage across the first and second output nodes. The first switching means is also coupled to the second input node and the second output node in such a way that the sampling capacitor means is conductively connected to the second input node and disconnected from the second output node in the first switching state and the sampling capacitor means is disconnected from the second input node and conductively connected to the second output node in the second switching state. A second charge-storing element is coupled via the second switching means to the second input node in such a way that the second charge-storing element is charged in the first switching state and discharged in the second switching state, thereby at least partly compensating current flow from the second input node for charging the sampling capacitor means in the first switching state. A compensation current flows to the second input node in the second switching state.

The first switching means may comprise a first sampling switch and a second sampling switch, which are coupled between the first input and output nodes, and a third sampling switch and a fourth sampling switch, which are coupled between the second input and output nodes. Terminals of the sampling capacitor means are arranged between the first and second sampling switches as well as between the third and fourth sampling switches. The capacitor means comprises at least one capacitor. In the first switching state, which is the sampling phase, the first and third sampling switches are ON, thereby conductively connecting the sampling capacitor means to the input nodes but not to the output nodes. In the second switching state, which is the non-sampling phase, the second and fourth sampling switches are ON, thereby providing the charge having been stored in the capacitor means to the output nodes.

The first charge-storing element comprising a first capacitor is charged via a first buffer amplifier means. Alternatively or additionally the second charge-storing element comprising a second capacitor is charged via a second buffer amplifier means. Each buffer amplifier means comprises a buffer amplifier, which may also be regarded as a buffer. The buffer amplifier provides a current for loading the capacitor so that no current is required from the input node.

The noise of the buffer is not injected into the signal since the charge is restored to the input node during the non-sampling phase. In case of having a low impedance input source, the noise is absorbed by the input source during the non-sampling phase. In case of having a very high-impedance input source, it may be necessary to use an external capacitor connected to the input nodes for getting a stable input signal. During the non-sampling phase, the noise injected by the charge-pump first and second capacitors and the buffer amplifiers is filtered out by the external capacitor.

Moreover, although buffer amplifiers are used, the speed requirements are twice lower than in conventional arrangements including buffers. Thus current saving is achieved without any performance degradation. Moreover, both differential and common mode input current is cancelled out since the input current is compensated at each input branch.

Overall, the circuit arrangement achieves noise reduction, space and current consumption reduction compared to conventional circuits.

In one embodiment, the first buffer amplifier means has an input, which is coupled to the first input node, and an output. The second buffer amplifier means has an input that is coupled to the second input node, and an output. The first capacitor is conductively coupled to the outputs of the first and second buffer amplifier means in the first switching state, and at least one terminal of the first capacitor is disconnected from the outputs of the first and second buffer amplifier means in the second switching state. The second capacitor is conductively coupled to the outputs of the first and second buffer amplifier means in the first switching state, and at least one terminal of the second capacitor is disconnected from the outputs of the first and second buffer amplifier means in the second switching state. Thereby, the first and second capacitors may be charged during the first switching state when the voltage across the input nodes is sampled.

A first circuit branch comprises the first buffer amplifier means, a downstream first switch, and second switch downstream of the first switch. The input of the first buffer amplifier means and the second switch are coupled to the first input node. A second circuit branch comprises the second buffer amplifier means, a downstream third switch, and a fourth switch downstream of the third switch. The input of the second buffer amplifier means and the fourth switch are coupled to the second input node. A fifth switch and a downstream sixth switch are coupled between the outputs of the first and second buffer amplifier means. A seventh switch and a downstream eighth switch are coupled between the outputs of the first and second buffer amplifier means.

One terminal of the first capacitor is arranged between the first and second switches; the other terminal of the first capacitor is arranged between the fifth and sixth switches. One terminal of the second capacitor is arranged between the third and fourth switches; the other terminal of the second capacitor is arranged between the seventh and eighth switches.

During the first switching state the first, third, fifth and seventh switches are ON. The second, fourth, sixth and eighth switches are OFF. Currents provided by the buffer amplifiers flow via the first and fifth switches to the first capacitor and via the third and seventh switches to the second capacitor, thereby charging them. The first and second capacitors are conductively connected between the buffer amplifiers in parallel in the first switching state. During the second switching state the first, third, fifth and seventh switches are OFF. The second, fourth, sixth and eighth switches are ON. Currents flow from the first and second capacitors to the first and second input nodes, respectively.

This arrangement allows that the first and second capacitors are conductively connected in parallel in the first switching state, thereby charging the first and second capacitors. In the second switching state, the first and second capacitors are discharged. The resulting currents flow to the first and second input nodes in order to at least partly compensate the current for charging the sampling capacitor means.

The capacitances of the first and second capacitors are equal or nearly equal in order to achieve good current compensation. Nevertheless, compensation errors caused by offsets of the buffer amplifiers may occur. These may be cancelled out by chopping means comprised by the first and second buffer amplifier means. The chopping means of the buffer amplifier means are arranged at the input and output of the buffer amplifier.

Differences in the capacitances may be compensated by a switching scheme wherein the capacitors that serve as first and second capacitors and the capacitors of the sampling capacitor means interchange. A third switching means has a first pair of terminals, a second pair of terminals and a third pair of terminals and is coupled between the first and second switching means and capacitive means containing the first capacitor, the second capacitor and the sampling capacitor means. A control means is suitable for controlling the third switching means in such a way that one of the capacitive means is conductively coupled between the first pair of terminals, another one of the capacitive means is conductively coupled between the second pair of terminals, and another one of the capacitive means is conductively coupled between the third pair of terminals, thereby coupling the capacitive means to the pairs of terminals in a given coupling order. Furthermore, the control means is suitable for changing the coupling order.

In one embodiment, a first terminal is arranged between the first and second sampling switches. A second terminal is arranged between the third and fourth sampling switches. A third terminal is arranged between the first and second switches. A fourth terminal is arranged between the fifth and sixth switches. A fifth terminal is arranged between the third and fourth switches. A sixth terminal is arranged between the seventh and eighth switches. The control means is suitable for controlling the third switching means in such a way that one of the capacitive means is coupled between the first and second terminals being one pair of terminals, another one of the capacitive means is coupled between the third and fourth terminals being one pair of terminals, and another one of the capacitive means is coupled between the fifth and sixth terminals being one pair of terminals. The control means is also suitable for changing the coupling of the capacitor means, thereby changing the order in which the capacitive means are coupled between the pairs of terminals. The order may be changed in a rotating manner.

The circuit arrangement can be used in every analog-to-digital converter in which a high input impedance is desired or needed. Especially, the circuit arrangement is useful in resistive measurement systems like resistive environmental, chemical or physical sensors (e.g. for pressure, temperature, humidity, gas sensors etc.). It is also useful in high-speed low power monolithic temperature sensors. Such kind of systems can be found in industrial products as well as in consumer products.

In one embodiment a method of operation concerns a circuit arrangement comprising a sampling capacitor means that is conductively connected to a first input node and disconnected from a first output node in a first switching state and that is disconnected from the first input node and conductively connected to the first output node in a second switching state, which allows sampling at the first input node and providing the sampling value to the first output node. The method comprises charging a first charge-storing element in the first switching state and discharging it in the second switching state in such a manner that a first current flows to the first input node in the second switching state.

In one embodiment, the sampling capacitor means is conductively connected to a second input node and disconnected from a second output node in the first switching state and is disconnected from the second input node and conductively connected to the second output node in a second switching state, which allows differential sampling. In this case, the method further comprises: charging a second energy-storing element in the first switching state and discharging it in the second switching state in such a manner that a second current flows to the second input node in the second switching state.

The first charge-storing element is charged via a first buffer amplifier means. The first current is suitable for at least partly compensating a current having charged the sampling capacitor means in the first switching state. The second charge-storing element is charged via a second buffer amplifier means. The second current is suitable for at least partly compensating a current having charged the sampling capacitor means in the first switching state. The buffer amplifiers provide the current for loading the first and second capacitors so that no current is required from the input nodes. The compensating currents flowing to the first and second input nodes in the second switching state compensate the current needed for charging the sampling capacitor means in the first switching state.

BRIEF DESCRIPTION OF THE DRAWINGS

Non-limiting, exemplary embodiments of the circuit arrangement will now be described with reference to the accompanying drawings, in which.

DETAILED DESCRIPTION

Figure 1:
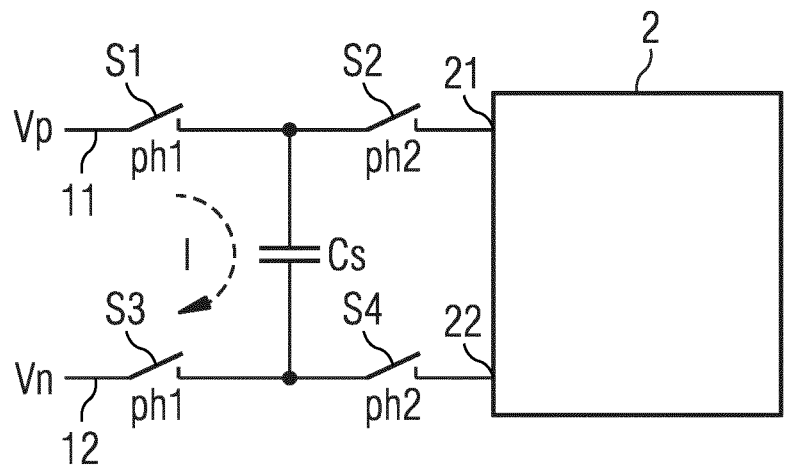
FIG. 1 shows an embodiment of a conventional switched capacitor sampling circuit.

FIG. 1 shows an embodiment of a conventional generic switched capacitor sampling circuit that comprises first and second input nodes 11, 12. The first input node 11 is coupled via a first sampling switch S1 and a second sampling switch S2 to a first output node 21. The second input node 12 is coupled via a third sampling switch S3 and a fourth sampling switch S4 to a second output node 22. The first and second output nodes 21, 22 are connected to a further circuit 2 that may process the sampled information provided by a sampling capacitor Cs. One terminal of the sampling capacitor Cs is arranged between the first and second sampling switches S1, S2. The other terminal of the sampling capacitor Cs is arranged between the third and fourth sampling switches S3, S4.

During a first switching state the first and third sampling switches are ON, which means they are in conducting states; thereby the sampling capacitor Cs is conductively connected to the first and second input nodes 11, 12. The second and fourth sampling switches S2, S4 are OFF, which means they are in non-conducting states; thereby the sampling capacitor Cs is conductively disconnected from the output nodes 21, 22. A current I flows between the input nodes 11, 12, thereby charging the sampling capacitor Cs.

During a second switching state the first and third sampling switches S1, S3 are OFF; thereby the sampling capacitor Cs is conductively disconnected from the first and second input nodes 11, 12. The second and fourth sampling switches S2, S4 are ON; thereby the sampling capacitor Cs is conductively connected to the first and second output nodes 21, 22 and the charge stored by the sampling capacitor Cs is provided to the further circuit 2. The sampling switches that are ON in the first switching state are indicated by ph1. The switches that are ON in the second switching state are indicated by ph2.

The sampling capacitor Cs is connected via the two pairs of sampling switches S1, S3 and S2, S4 with a given frequency alternately to the first and second input nodes 11, 12 and to the first and second output nodes 21, 22. Each switching cycle transfers a certain amount of charge from the input nodes 11, 12 to the output nodes 21, 22 at a switching frequency Fs.

The sampling circuit as shown in FIG. 1 samples a differential input voltage Vp−Vn into the sampling capacitor Cs. If the sampling is performed at the frequency Fs, the averaged input current I in such a structure is:

$$I = F_s \cdot C_s \cdot (V_p - V_n) \quad (1).$$

Hence, the equivalent input impedance of the sampling circuit is:

$$Z = (V_p - V_n)/I = 1/(F_s \cdot C) \quad (2).$$

Figure 2:
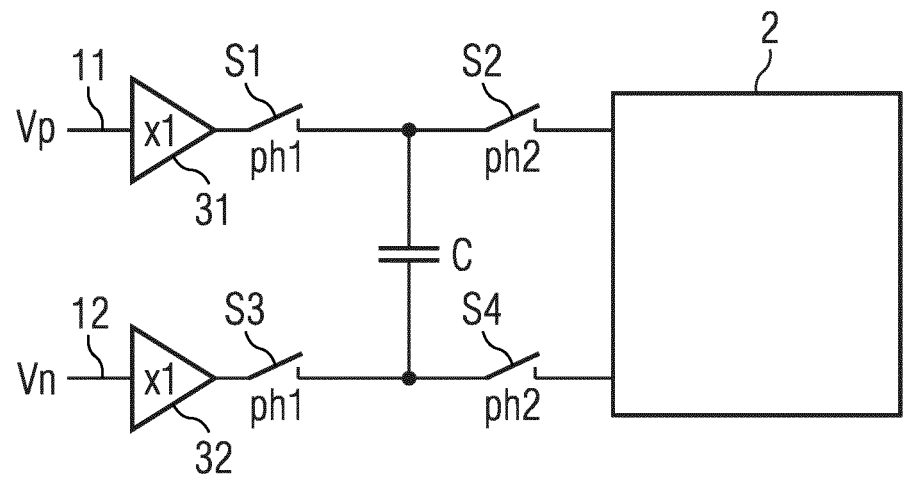
FIG. 2 shows a further embodiment of a conventional switched capacitor sampling circuit.

FIG. 2 shows a further embodiment of a conventional switched capacitor sampling circuit that differs from the embodiment shown in FIG. 1 by a first buffer amplifier 31 and a second buffer amplifier 32 also regarded as first and second buffers. This sampling circuit is a high-input impedance switched capacitor sampling circuit using buffers.

The first buffer amplifier 31 is arranged between the first input node 11 and the first sampling switch S1. The second buffer amplifier 32 is arranged between the second input node 12 and the third sampling switch S3. In this embodiment the first and second input nodes 11, 12 are decoupled from the sampling switches S1, S2, S3, S4 by way of the first and second buffer amplifiers 31, 32. Thereby, the input current is provided by the buffer amplifiers 31, 32 instead of by the input signal. The main drawbacks of using input buffers in front of the sampling circuit are: Noise and offset voltages of the buffers are introduced into the sampled voltage. Current consumption and space requirement of the system are increased.

Figure 3:
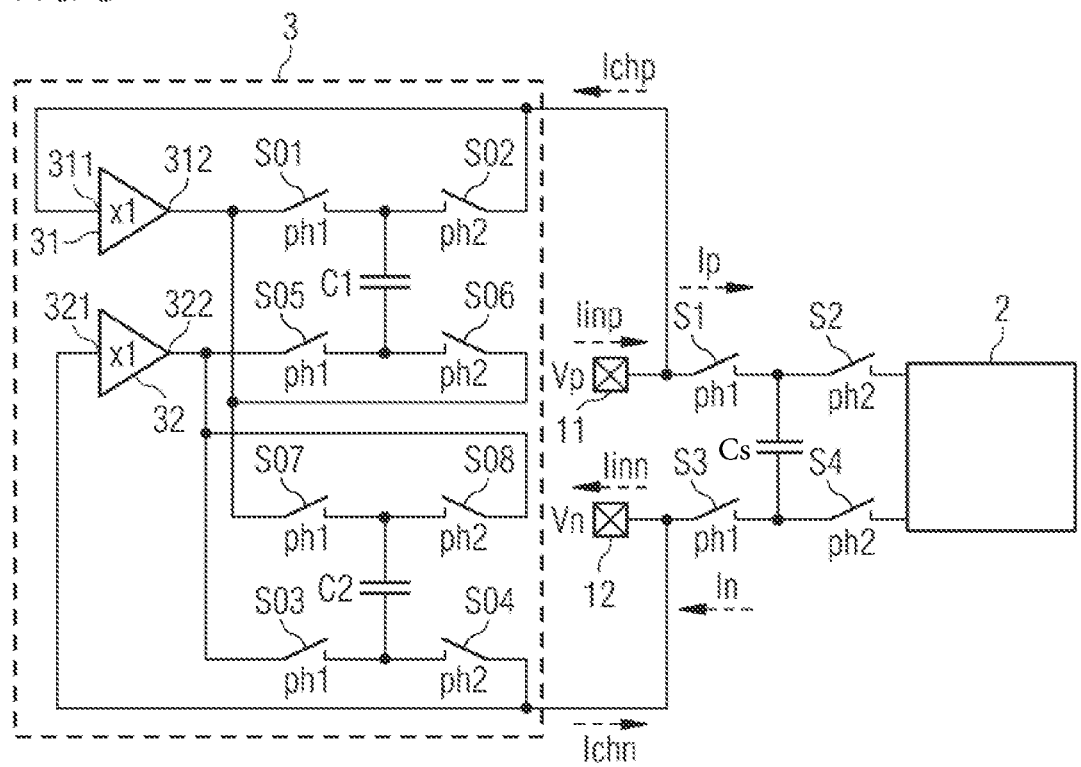
FIG. 3 shows an embodiment of a circuit arrangement.

FIG. 3 shows an embodiment of a circuit arrangement as proposed. This embodiment comprises an input current compensation circuit 3 for a generic switched capacitor front-end. The high input impedance switched-capacitor circuit input current is compensated by using capacitive charge-pumps.

The circuit arrangement includes a sampling capacitor Cs and first, second, third and fourth sampling switches S1, S2, S3, S4 as arranged in and described in connection with FIG. 1. This sampling circuit may serve as an ADC input. The circuit arrangement further comprises the input current compensation circuit 3, which is coupled to the first and second input nodes 11, 12.

The input current compensation circuit 3 comprises a first capacitor C1 and a second capacitor C2, both charge-storing elements serving as charge-pump capacitors. A second switching means allows charging and discharging the first and second capacitors C1, C2. The second switching means comprises a first switch S01, a second switch S02, a third switch S03, a fourth switch S04, a fifth switch S05, a sixth switch S06, a seventh switch S07 and an eighth switch S08.

A first circuit branch comprises a first buffer amplifier 31 having an input 311 and an output 312, the first switch S01 and the second switch S02. The first switch S01 is coupled downstream of the output 312. The second switch S02 is coupled downstream of the first switch S01. The input 311 of the first buffer amplifier 31 and the second switch S02 are connected to the first input node 11.

A second circuit branch comprises a second buffer amplifier 32 having an input 321 and an output 322, the third switch S03 and the fourth switch S04. The third switch S03 is coupled downstream of the output 322. The fourth switch S04 is coupled downstream of the third switch S03. The input 321 of the second buffer amplifier 32 and the fourth switch S04 are connected to the second input node 12.

The fifth switch S05 and the sixth switch S06 are coupled between the outputs 312, 322 of the first and second buffer amplifiers 31, 32. The seventh switch S07 and the eighth switch S08 are coupled between the outputs 312, 322 of the first and second buffer amplifiers 31, 32.

During the first switching state not only the first and third sampling switches S1, S3 are ON but also the first, third, fifth and seventh switches S01, S03, S05, S07, which is indicated by ph1. The second and fourth sampling switches S2, S4 as well as the second, fourth, sixth and eighth switches S02, S04, S06, S08 are OFF. Thus, the sampling capacitor Cs and the first and second capacitors C1, C2 are charged in dependence on the voltage difference Vp–Vn across the first and second input nodes 11, 12.

During the second switching state not only the second and fourth sampling switches S2, S4 but also the second, fourth, sixth and eighth switches S02, S04, S06, S08 are ON. The first and third sampling switches S1, S3 and the first, third, fifth and seventh switch S01, S03, S05, S07 are OFF. During the second switching state charge stored in the sampling capacitor Cs is provided to the further circuit 2. Furthermore, the charges stored in the first and second capacitors C1, C2 cause current flow to the first and second input nodes 11, 12, respectively. These currents compensate the current having flown for charging the sampling capacitor Cs.

The circuit arrangement is clocked is such a way that the first switching state, which may also be regarded as the first phase or sampling phase, and the second switching state, which may also be regarded as the second phase or non-sampling phase, alternate. The switches and sampling switches that are ON during the first switching state are indicated by ph1. The switches and sampling switches that are ON during the second switching state are indicated by ph2.

During the first switching state, i.e. the sampling phase, the input voltage across the first and second input nodes 11, 12 is sampled into the charge-pump first and second capacitors C1, C2 through the first and second input buffer amplifiers 31, 32. The buffer amplifiers 31, 32 provide currents for loading the charge-pump first and second capacitors C1, C2, so no current is required from the input signal at the first and second input nodes 11, 12. At the same clock phase, the input voltage is sampled into the sampling capacitor Cs. The average input current for charging the sampling capacitor Cs is the one described in equation (1) mentioned above.

During the second switching state, the charge stored in the sampling capacitor Cs during the previous first switching state is redistributed into the further circuit 2 of the analog front-end, which may be e.g. a switched capacitor integrator of a sigma-delta ADC. At the same clock phase the charge stored in the charge-pump first and second capacitors C1, C2 is restored to the input nodes 11, 12. Such charge is also restored from the buffer amplifiers 31, 32, avoiding any charge coming from any of the input nodes 11, 12. Restoring the charge compensates the current that has been sampled into the sampling capacitor Cs in the previous first switching state.

In case of a very high-impedance input source, it may be necessary to use an external capacitor connected to the ADC input, see Vp, Vn and 11, 12 in FIG. 3, for getting a stable input signal. During the non-sampling phase, the noise injected by the charge-pumps and the buffers may be filtered out by the external capacitor.

Coming back to FIG. 3, offset voltages of the buffer amplifiers 31, 32 used in the input current compensation circuit 3 as shown in FIG. 3 introduce an error in the current that is provided to the input nodes 11, 12. Another error source that leads to a non-ideal input current compensation is the mismatch between the charge-pump first and second capacitors C1, C2 and the sampling capacitor Cs. If all error sources are considered, the currents flowing through the uncompensated inputs are:

$$Ip = -In = (Vp - Vn) \cdot Fs \cdot C \tag{3}$$

The current provided by the charge-pump first and second capacitors C1, C2 at each input node 11, 12 are:

$$Ichp = -Ichn = C' \cdot Fs \cdot (-Vp + Vn - Voff1 + Voff2) \tag{4}$$

where C' is the capacitance of the first and second capacitors C1, C2 and Voff1 and Voff2 are the offsets of the buffer amplifiers 31, 32 used for input signals Vp and Vn, respectively.

The net current flowing through each input node 11, 12 is:

$$Iinp = -Iinn = Ip + Ichp = (C - C')(Vp - Vn) + C'(Voff2 - Voff1) \tag{5}$$

This equation (5) should be equal to zero. However, the above equation (5) clearly shows that the compensation may include errors which are caused by offset voltages of the buffer amplifiers 31, 32 and the capacitance differences between the capacitors Cs, C1, C2. The former causes the second term including Voff2−Voff1. The latter causes the mismatch term C-C'.

In order to minimise theses errors, a chopping technique can be used at the inputs and outputs of the buffer amplifiers 31, 32, which will reduce the values of the offsets Voff1 and Voff2.

The mismatch error expressed by the error term (C-C') can be minimised by dynamically rotating the capacitors Cs, C1, C2 between the charge-pump and the signal sampling network.

Figure 4A:
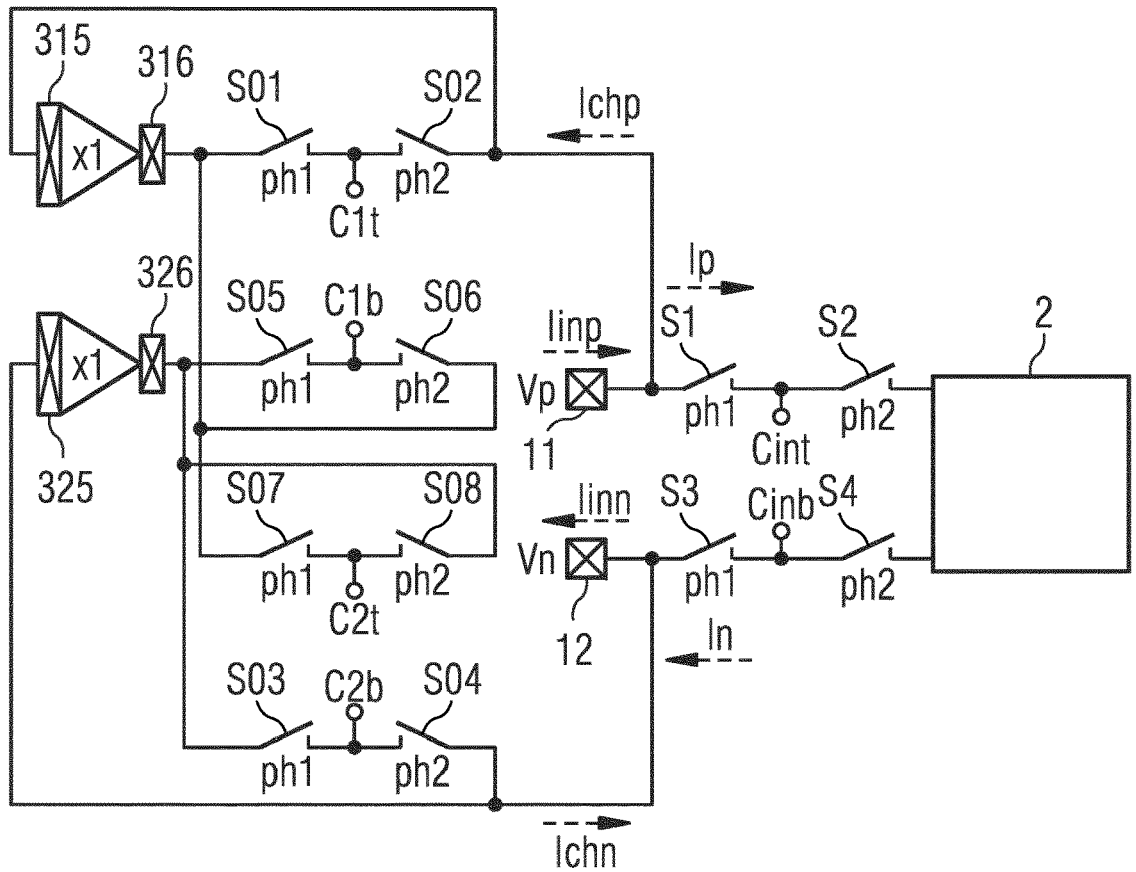
FIGS. 4a and 4b show a further embodiment of a circuit arrangement.
Figure 4B:
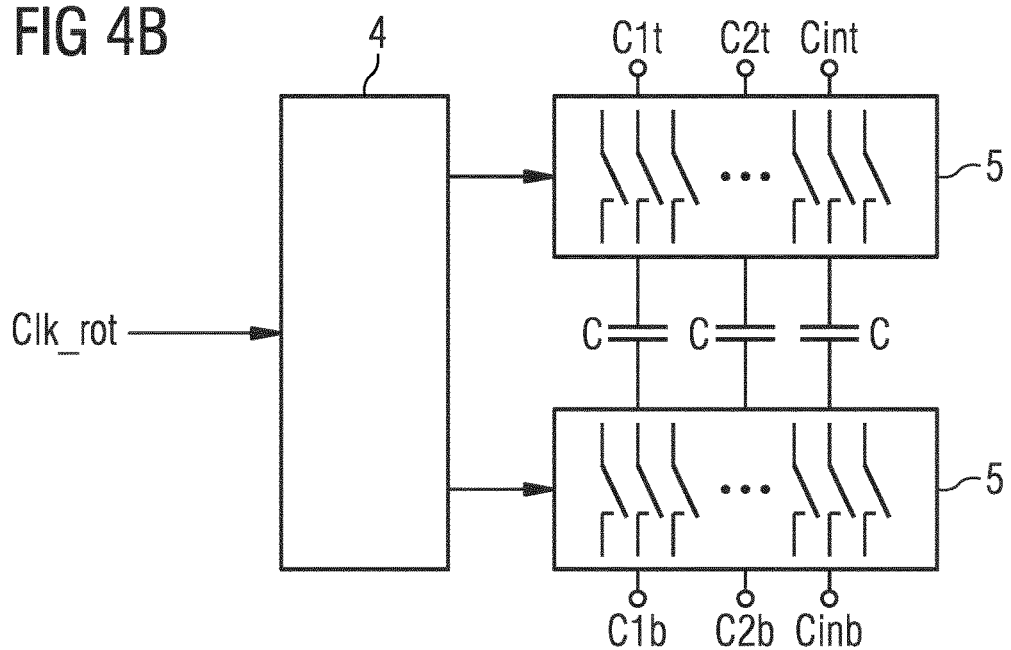

FIGS. 4a and 4b show a further embodiment including the above-mentioned means for minimising errors. In order to avoid repetition, only the differences with respect to FIG. 3 are described.

The first and second buffer amplifier means include buffer amplifiers 31, 32 having upstream and downstream chopping means 315, 316, 325, 326; chopping being a continuous-time modulation technique. First the input signal passes through a chopper 315, 325, which converts it to a square wave voltage at a chopping frequency. Then, the modulated signal is amplified by the buffer amplifier 31, 32. A further chopper 316, 326 demodulates the amplified signal back to DC. The offset will be filtered out by the chopping means 315, 316, 325, 326.

Furthermore, the switching means comprise a first terminal Cint arranged between the first and second sampling switches S1, S2, a second terminal Cinb arranged between the third and fourth sampling switches S3, S4, a third terminal C1t arranged between the first and second switches S01, S02, a fourth terminal C1b arranged between the fifth and sixth switches S05, S06, a fifth terminal C2t arranged between the seventh and eighth switches S07, S08 and a sixth terminal C2b arranged between the third and fourth switches S03, S04. One of the capacitors C containing the capacitors Cs, C1, C2, which serve as sampling and charge-pump capacitors, may be coupled between the first and second terminals Cint, Cinb. One of the capacitors C may be coupled between the third and fourth terminals C1t, C1b. One of the capacitors C may be coupled between the fifth and sixth terminals C2t, C2b. A control means 4 is suitable for controlling the third switching means comprising a multitude of switches 5 as shown in FIG. 4b; the switches 5 are coupled between the first, second, third, fourth, fifth and sixth terminals Cint, Cinb, C1t, C1b, C2t, C2b, and the capacitors C serving as sampling capacitor Cs and the first and second capacitors C1, C2. The multitude of switches 5 are controlled in such a way that one capacitor C may be conductively connected between the first and second terminals Cint, Cinb. One capacitor may be conductively connected between the third and fourth terminals C1t, C1b. One capacitor may be conductively connected between the fifth and sixth terminals C2t, C2b. The assignment of the capacitors to the terminals may be switched in a clockwise manner controlled by the control means 4. A clock signal Clk_rot is applied to the control means 4.

In one embodiment a rotation algorithm stored in the control means 4 causes rotation of the capacitors C in a clockwise manner. Such rotating capacitors C may contain a first, second and third rotating capacitor. First, the first rotating capacitor serves as the sampling capacitor Cs conductively connected between the first and second terminals Cint, Cinb; the second and third rotating capacitors serve as charge-pump first and second capacitors C1, C2 connected between the third and fourth terminals C1t, C1b and between the fifth and sixth terminals C2t, C2b, respectively. After switching, the third rotating capacitor serves as the sampling capacitor Cs conductively connected between the first and second terminals Cint, Cinb; the first and second rotating capacitors serve as charge-pump first and second capacitors C1, C2 connected between the third and fourth terminals C1t, C1b and between the fifth and sixth terminals C2t, C2b, respectively. After switching again, the second rotating capacitor serves as the sampling capacitor Cs conductively connected between the first and second terminals Cint, Cinb. The third and first rotating capacitors serve as charge-pump first and second capacitors C1, C2 connected between the third and fourth terminals C1t, C1b and between the fifth and sixth terminals C2t, C2b, respectively. Then, after switching again, the first rotating capacitor serves as the sampling capacitor Cs conductively connected again between the first and second terminals Cint, Cinb; the second and third rotating capacitors again serve as charge-pump first and second capacitors C1, C2, respectively. Other switching schemes that change the order of capacitors in a different way are conceivable.

It should be mentioned that embodiments of the circuit arrangement may comprise either chopping used in buffers or an implementation of the dynamic element matching/rotation of the capacitors. Alternative embodiments as described above include both.

The proposed technique for input current compensation can be used in all types of switched-capacitor circuits as sample-and-hold, sigma-delta ADCs, SAR ADCs, multiplying DAC etc.

Figure 5:
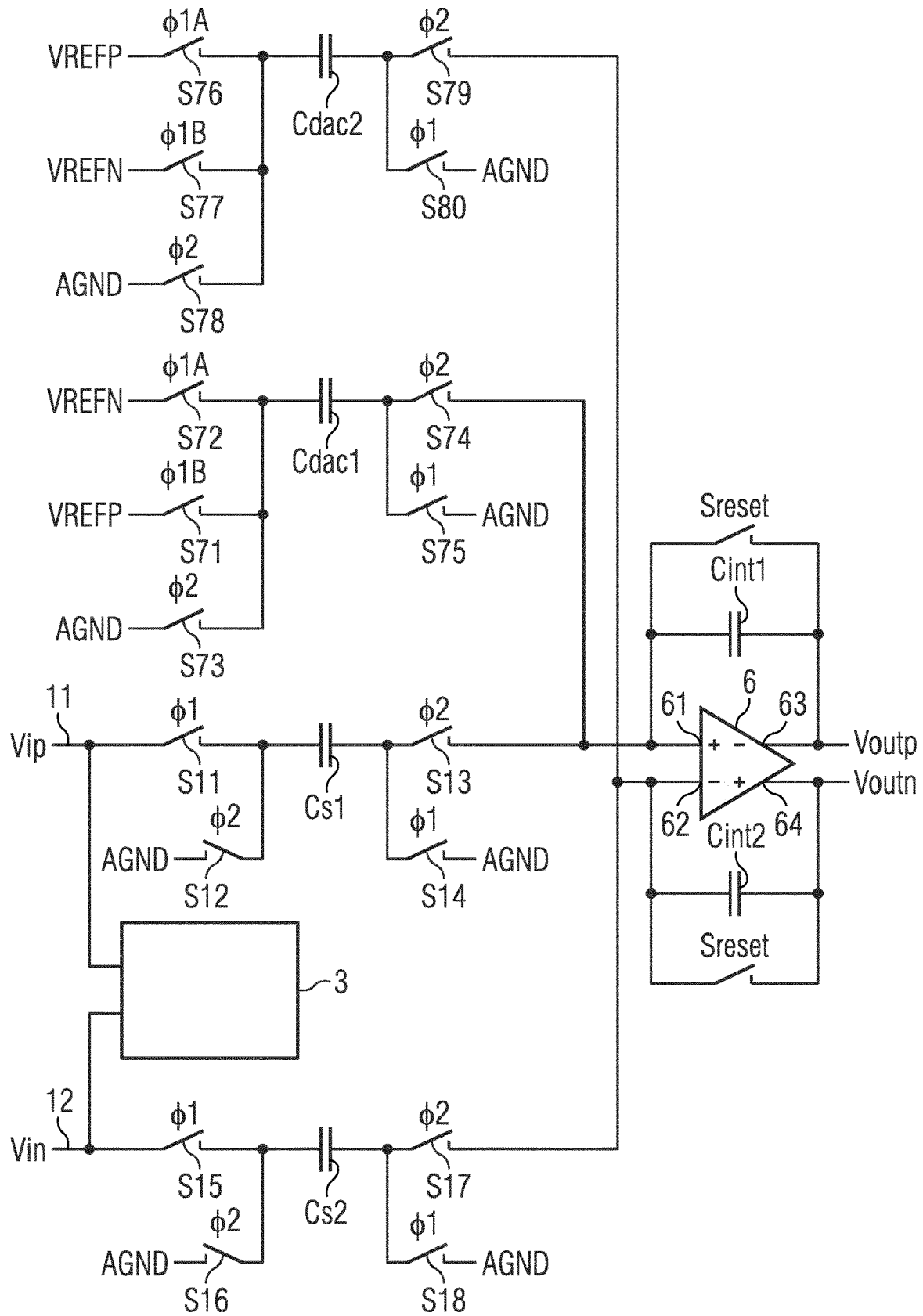
FIG. 5 shows an embodiment of a circuit arrangement including a switched capacitor integrator.

FIG. 5 shows an embodiment of a switched-capacitor integrator, which may commonly be used in sigma-delta modulators, including an input current compensation block 3 as exemplarily described in connection with FIG. 3 or 4a, 4b.

The circuit arrangement comprises a first input node 11 and a second input node 12; input voltages Vip, Vin may be applied to the first and second input nodes 11, 12.

The first and second input nodes 11, 12 are coupled to an input current compensation circuit 3 as exemplarily described in connection with FIG. 3 or 4a, 4b.

The sampling capacitor means comprises a first sampling capacitor Cs1 and a second sampling capacitor Cs2. One terminal of the first sampling capacitor Cs1 is coupled via a first sampling switch S11 to the first input node 11 and via a second sampling switch S12 to analog ground AGND. The other terminal of the first sampling capacitor Cs1 is coupled via a third sampling switch S13 to an input 61 of an operational amplifier 6 and via a fourth sampling switch S14 to analog ground AGND. The second sampling capacitor Cs2 is coupled in a similar way via a fifth sampling switch S15, a sixth sampling switch S16, a seventh sampling switch S17 and an eighth sampling switch S18 to the second input node 12, a second input 62 of the operational amplifier 6 and analog ground AGND.

The first input 61 of the operational amplifier 6 is coupled via a parallel connection of an integrating capacitor Cint1 and a reset switch Sreset to a first output 63 of the operational amplifier 6. The second input 62 of the operational amplifier 6 is coupled via a parallel connection of an integrating capacitor Cint2 and a reset switch Sreset to a second output 64 of the operational amplifier 6.

During a first switching state ph1, when the first, fourth, fifth and eighth sampling switches S11, S14, S15, S18 are ON and the second, third, sixth and seventh sampling switches S12, S13, S16, S17 are OFF, the sampling capacitors Cs1, Cs2 are charged. During a second switching state ph2, when the first, fourth, fifth and eighth sampling switches S11, S14, S15, S18 as well as the reset switches are OFF and the second, third, sixth and seventh sampling switches S12, S13, S16, S17 are ON, the charge is transferred to the integrating capacitors Cint1, Cint2, which may be discharged later when the reset switches Sreset are ON.

The above-mentioned circuit is part of a sigma-delta modulator, which further comprises a 1-bit digital-to-analog converter (DAC) including a first digital-to-analog converter capacitor Cdac1 and a second digital-to-analog converter capacitor Cdac2. One terminal of the first digital-to-analog converter capacitor Cdac1 is coupled via a switch S71 to a first reference voltage VREFP and via a switch S72 to a second reference voltage VREFN and via a switch S73 to analog ground AGND. The other terminal is coupled via a switch S74 to the first input 61 of the operational amplifier 6 and via a further switch S75 to analog ground AGND. The second digital-to-analog converter capacitor Cdac2 is coupled in a similar way via switches S76, S77, S78, S79, S80 to the reference voltages VREFP, VREFN, analog ground AGND and the second input 62 of the operational amplifier 6.

During the first switching state the first and second digital-to-analog converters Cdac1, Cdac2 are charged by conductively connecting them to either the first reference voltage VREFP or the second reference voltage VREFN. During the second switching state these charges are transferred to the inputs 61, 62 of the operational amplifier 6, which serve as summing points of the charges flowing from the digital-to-analog converters Cdac1, Cdac2 and the sampling converters Cs1, Cs2 that provide their stored charges in the same phase. The resulting current values are integrated by the integrating capacitors Cint1, Cint2.

The switches and sampling switches that are ON in the first switching state and OFF in the second switching state are indicated by Φ1, Φ1A and Φ1B. The switches and sampling switches that are OFF in the first switching state and ON in the second switching state are indicated by Φ2.

The analog input voltage and the output of the 1-bit digital-to-analog converter (DAC) are differentiated, providing an analog voltage at the operational amplifier 6. This voltage is presented to the integrator, whose output Voutp, Voutn progresses in a negative or positive direction.

However, the proposed technique can be used in all types of switched-capacitor circuits, such as: sample-and-hold, sigma-delta ADCs, SAR ADCs, multiplying DAC etc.

The scope of protection is not limited to the examples given herein above. The circuit arrangement is embodied in each novel characteristic and each combination of characteristics, which particularly includes every combination of any features which are stated in the claims, even if this feature or this combination of features is not explicitly stated in the claims or in the examples.

The invention claimed is:

1. A circuit arrangement comprising
    a first input node;
    a first output node;
    a sampling capacitor means;
    a first switching means being switchable between a first switching state and a second switching state, the first switching means being coupled to the sampling capacitor means, the first input node and the first output node in such a way that the sampling capacitor means is conductively connected to the first input node and disconnected from the first output node in the first switching state and the sampling capacitor means is disconnected from the first input node and conductively connected to the first output node in the second switching state;
    a first charge-storing element being coupled via a second switching means to the first input node in such a way that the first charge-storing element is charged in the first switching state and discharged in the second switching state, thereby at least partly compensating current flow for charging the sampling capacitor means in the first switching state.

2. The circuit arrangement according to claim 1, further comprising
    a second input node;
    a second output node;
    a second charge-storing element being coupled via the second switching means to the second input node in such a way that the second charge-storing element is charged in the first switching state and discharged in the second switching state;
    wherein the first switching means is coupled to the second input node and the second output node in such a way that the sampling capacitor means is conductively connected to the second input node and disconnected from the second output node in the first switching state and the sampling capacitor means disconnected from the second input node and conductively connected to the second output node the second switching state, thereby at least partly compensating current flow for charging the sampling capacitor means the first switching state.

3. The circuit arrangement according to claim 1, wherein the first charge-storing element comprising a first capacitor is charged via a first buffer amplifier means and/or the second charge-storing element comprising a second capacitor is charged via a second buffer amplifier means.

4. The circuit arrangement according to claim 3, wherein the capacitances of the first and second capacitors are equal or nearly equal.

5. The circuit arrangement according to claim 3, wherein the first and/or second buffer amplifier means comprise chopping means.

6. The circuit arrangement according to claim 3, wherein:
    the first buffer amplifier means has an input that is coupled to the first input node and an output, and the second buffer amplifier means has an input that is coupled to the second input node and an output;
    the first capacitor conductively coupled to the outputs of the first and second buffer amplifier means in the first switching state and at least one terminal of the first capacitor being disconnected from the outputs of the first and second buffer amplifier means the second switching state;
    the second capacitor being conductively coupled to the outputs of the first and second buffer amplifier means in the first switching state and at least one terminal of the second capacitor being disconnected from the outputs of the first and second buffer amplifier means the second switching state;
    the first and second capacitors being conductively connected in parallel in the first switching state.

7. The circuit arrangement according to claim 3, wherein a first circuit branch comprises the first buffer amplifier means, a downstream first switch and second switch downstream of the first switch; the input of the first buffer amplifier means and the second switch being coupled to the first input node.

8. The circuit arrangement according to claim 3, wherein a second circuit branch comprises the second buffer amplifier means, a downstream third switch a fourth switch downstream of the third switch; the input of the second buffer amplifier means and the fourth switch being coupled to the second input node.

9. The circuit arrangement according to claim 8,
wherein a fifth switch and a downstream sixth switch are coupled between the outputs of the first and second buffer amplifier means; and
wherein a seventh switch and a downstream eighth switch coupled between the outputs of the first and second buffer amplifier means.

10. The circuit arrangement according to claim 9,
wherein one terminal of the first capacitor is arranged between the first and second switches the other terminal of first capacitor being arranged between the fifth and sixth switches; and
wherein one terminal of the second capacitor arranged between the third and fourth switches the other terminal of second capacitor being arranged between the seventh and eighth switches.

11. The circuit arrangement according to claim 2, wherein: the first switching means comprises a first sampling switch and a second sampling switch that are coupled between the first input and output nodes, and a third sampling switch and a fourth sampling switch that are coupled between the second input and output nodes.

12. The circuit arrangement according to claim 11, further comprising
third switching means having a first pair of terminals, a second pair of terminals and a third pair of terminals and being coupled between the first and second switching means and the capacitive means containing the first capacitor, the second capacitor and the sampling capacitor means;
a control means for controlling the third switching means in such a way that one of the capacitive means is conductively coupled between the first pair of terminals, another one of the capacitive means is conductively coupled between the second pair of terminals and another one of the capacitive means is conductively coupled between the third pair of terminals; thereby coupling the capacitive means to the pairs of terminals in a given coupling order; the control means suitable for changing the coupling order.

13. An analog-to-digital converter comprising the circuit arrangement according to claim 1.

14. A measurement device comprising the circuit arrangement according to claim 12.

15. A method for operating a circuit arrangement comprising a sampling capacitor means that is conductively connected by a first switching means to a first input node and disconnected from a first output node in a first switching state of the first switching means and that is disconnected from the first input node and conductively connected to the first output node a second switching state of the first switching means; the method comprising:
charging a first charge-storing element which is coupled via a second switching means to the first input node, in the first switching state of the first switching means and discharging it in the second switching state of the first switching means in such a manner that a first compensation current flows to the first input node in the second switching state of the first switching means.

16. The method according to claim 15, wherein the sampling capacitor means is conductively connected to a second input node and disconnected from a second output node a first switching state and the sampling capacitor means is disconnected from the second input node and conductively connected to the second output node in a second switching state; the method further comprising:
charging a second energy-storing element in the first switching state and discharging it in the second switching state in such a manner that a second compensation current flows to the second input node in the second switching state.

17. The method according to claim 15, wherein the first charge-storing element is charged via a first buffer amplifier means; the first compensation current being suitable for at least partly compensating a current having charged the sampling capacitor means in the first switching state; and/or
wherein the second charge-storing element is charged via a second buffer amplifier means; the second compensation current being suitable for at least partly compensating a current having charged the sampling capacitor means in the first switching state.

18. The circuit arrangement according to claim 3, wherein the first capacitor is forming a first charge source for providing a current flowing to the first input node in the second switching state, thereby at least partly compensating the current flow for charging the sampling capacitor means in the first switching state.

* * * * *